United States Patent
Li et al.

(10) Patent No.: US 10,690,853 B2
(45) Date of Patent: Jun. 23, 2020

(54) OPTOELECTRONICS INTEGRATION USING SEMICONDUCTOR ON INSULATOR SUBSTRATE

(71) Applicant: International Business Machines Corporation, Armonk, NY (US)

(72) Inventors: Ning Li, White Plains, NY (US); Devendra K. Sadana, Pleasantville, NY (US); Christopher Heidelberger, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/016,653

(22) Filed: Jun. 25, 2018

(65) Prior Publication Data

US 2019/0391328 A1    Dec. 26, 2019

(51) Int. Cl.
| | |
|---|---|
| *G02B 6/136* | (2006.01) |
| *G02B 6/13* | (2006.01) |
| *G02B 6/12* | (2006.01) |
| *G02B 6/124* | (2006.01) |

(52) U.S. Cl.
CPC ............ *G02B 6/136* (2013.01); *G02B 6/131* (2013.01); *G02B 6/12004* (2013.01); *G02B 6/124* (2013.01); *G02B 2006/121* (2013.01); *G02B 2006/12038* (2013.01); *G02B 2006/12061* (2013.01)

(58) Field of Classification Search
None
See application file for complete search history.

(56) References Cited

U.S. PATENT DOCUMENTS

| | | | |
|---|---|---|---|
| 7,547,914 B2 | 6/2009 | Kermarec et al. | |
| 7,705,370 B2 | 4/2010 | Fitzgerald | |
| 7,749,817 B2 | 7/2010 | Kermarec et al. | |
| 8,012,592 B2 | 9/2011 | Fitzgerald | |
| 8,120,060 B2 | 2/2012 | Fitzgerald | |
| 8,664,739 B2 | 3/2014 | King et al. | |
| 8,741,684 B2 | 6/2014 | Bogaerts et al. | |
| 9,040,391 B2 | 5/2015 | Damlencourt et al. | |
| 9,142,585 B2 | 9/2015 | King et al. | |
| 2006/0281232 A1* | 12/2006 | Hsu | H01L 21/8221 438/149 |
| 2007/0010066 A1* | 1/2007 | Takaya | H01L 21/02071 438/396 |
| 2007/0217750 A1 | 9/2007 | Budd et al. | |
| 2015/0030047 A1 | 1/2015 | Cheng et al. | |
| 2015/0249212 A1 | 9/2015 | Kim et al. | |
| 2015/0333481 A1 | 11/2015 | Van Thourhout | |

(Continued)

FOREIGN PATENT DOCUMENTS

CN    102437129 B    9/2014

OTHER PUBLICATIONS

ESPACENET, Bibliographic data and abstract of CN102437129(B).

*Primary Examiner* — Jerry Rahll
(74) *Attorney, Agent, or Firm* — Erik Johnson; Otterstedt, Wallace & Kammer, LLP

(57) ABSTRACT

A III-V optoelectronic light emitting device is epitaxially formed on a semiconductor on insulator substrate over a buried waveguide core. The device is optically coupled to the underlying waveguide core. A MOSFET device is formed on a semiconductor substrate beneath the insulator that contains the waveguide core.

10 Claims, 5 Drawing Sheets

(56) References Cited

U.S. PATENT DOCUMENTS

| | | |
|---|---|---|
| 2015/0364515 A1 | 12/2015 | King et al. |
| 2016/0252677 A1 | 9/2016 | Cheng et al. |
| 2016/0276330 A1 | 9/2016 | Leobandung et al. |
| 2016/0293801 A1 | 10/2016 | Leobandung |
| 2017/0018715 A1 | 1/2017 | Kim |
| 2017/0123150 A1 | 5/2017 | Budd |
| 2017/0123151 A1 | 5/2017 | Budd |
| 2017/0123152 A1 | 5/2017 | Budd |
| 2017/0123153 A1 | 5/2017 | Budd |
| 2017/0123168 A1 | 5/2017 | Budd |
| 2017/0125457 A1 | 5/2017 | Leobandung |
| 2017/0141142 A1 | 5/2017 | Leobandung |
| 2017/0170632 A1 | 6/2017 | Leobandung |
| 2017/0179681 A1 | 6/2017 | Barwicz |
| 2018/0217329 A1 | 8/2018 | Budd |
| 2018/0323123 A1 | 11/2018 | Lee |
| 2019/0134420 A1 | 5/2019 | Deligianni |
| 2019/0214413 A1 | 7/2019 | Leobandung |
| 2019/0221592 A1 | 7/2019 | Leobandung |

* cited by examiner

OPTOELECTRONICS INTEGRATION USING SEMICONDUCTOR ON INSULATOR SUBSTRATE

BACKGROUND

The present invention relates generally to the electrical, electronic and computer arts and, more particularly, to the formation of optoelectronic structures.

III-V light sources such as multiple quantum well (MQW) lasers have been co-integrated with low-loss waveguides and silicon-based CMOS devices in the fabrication of photonic circuits. The III-V light source is optically coupled to the waveguide. Photonic integrated circuits allow signals to propagate signals at the speed of light.

The performance of devices fabricated using dissimilar semiconductor materials can be materially affected by defects that cause abrupt changes in electrical and/or optical properties. III-V semiconductors have larger lattice constants than silicon, so integrating them on silicon is challenging. III-V light sources have been bonded to waveguides using plasma-assisted wafer bonding wherein the components are exposed to an oxygen plasma before being pressed together. Misfit defects and threading dislocations are avoided by using such bonding techniques, but bonding may result in the misalignment of optical components and possible optical losses within the photonic circuits. A monolithic structure 20 including a III-V light source 22 bonded to a front-end-of-line assembly 24 is shown in FIG. 9. The monolithic structure includes a silicon wafer 26, a silicon dioxide layer 28 on the silicon wafer, and a silicon layer on the silicon dioxide layer. The silicon layer includes a first region comprising a waveguide core 30. A CMOS device 32 including source/drain regions 32' is formed from a second region of the silicon layer. The CMOS device and waveguide core are encapsulated by a first dielectric layer 34A. Metal via conductors 36 within the dielectric layer 34A are electrically connected to the source/drain regions and the gate electrode of the CMOS device. The III-V light source 22 is encapsulated by a second metallized dielectric layer 34B that includes metal conductors 36 therein. Additional metallized dielectric layers 34C, 34D are formed over the second metallized dielectric layer 34B in further back-end-of-line (BEOL) processing.

BRIEF SUMMARY

A monolithic structure including a III-V light source and an optically associated waveguide and fabrication of such a monolithic structure are aspects of inventions disclosed herein.

In one aspect, an exemplary method of fabricating a monolithic structure includes obtaining a first structure including a semiconductor substrate including a first region and a second region, the second region being laterally displaced from the first region, a bottom dielectric layer on the semiconductor substrate, and a buried waveguide core within the bottom dielectric layer and directly above the first region of the semiconductor substrate. A semiconductor layer is formed on the bottom dielectric layer. A recess is formed within the bottom dielectric layer over the second region of the semiconductor substrate and a field-effect transistor is formed in the second region of the semiconductor substrate. The recess is filled with dielectric material. First electrical conductors are formed within the dielectric material and are electrically connected to the field-effect transistor. The semiconductor layer is patterned to form a semiconductor device layer over the first region of the semiconductor substrate. The method further includes epitaxially growing a plurality of III-V semiconductor layers on the semiconductor device layer over the first region of the semiconductor substrate, the III-V semiconductor layers comprising an optoelectronic structure configured for light emission. The optoelectronic structure is patterned. A top dielectric layer is formed over the bottom dielectric layer and the dielectric material and encapsulates the optoelectronic structure. Second electrical conductors are formed within the top dielectric layer. The second electrical conductors are electrically connected to the first electrical conductors and to the optoelectronic structure.

In a further aspect, a monolithic optoelectronic structure includes a silicon semiconductor substrate including a first region and a second region, the second region being laterally displaced from the first region. A bottom dielectric layer is on the semiconductor substrate. A buried waveguide core is within the bottom dielectric layer and directly above the first region of the semiconductor substrate. A monocrystalline semiconductor device layer comprising germanium is on a top surface of the bottom dielectric layer and positioned above the waveguide core. A field-effect transistor is in the second region of the semiconductor substrate and beneath the bottom dielectric layer. A plurality of first electrical conductors are within the bottom dielectric layer and electrically connected to the field-effect transistor. An optoelectronic device comprising a plurality of epitaxial III-V semiconductor layers is on the semiconductor device layer. A top dielectric layer is over the bottom dielectric layer and encapsulates the optoelectronic device. A plurality of second electrical conductors within the top dielectric layer are electrically connected to the first electrical conductors and to the optoelectronic device.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Integration of III-V light source on a silicon substrate;
Avoidance of alignment problems of optical components;

Enables formation of III-V light source over a buried dielectric waveguide.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
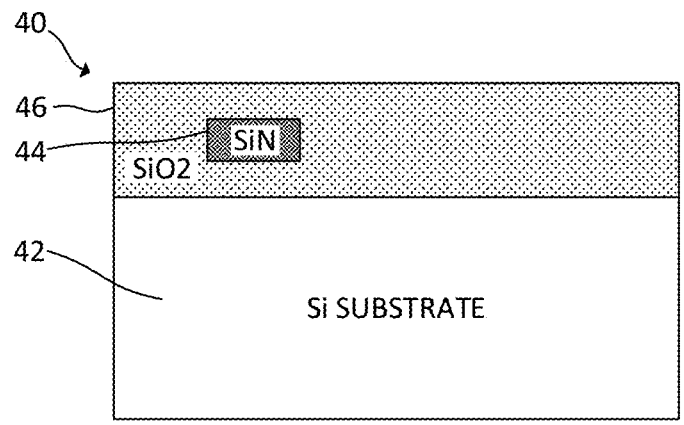
FIG. 1 is a schematic, cross-sectional illustration of a monolithic structure including a bulk semiconductor substrate and a waveguide embedded within a dielectric layer.

A structure 40 including a bulk semiconductor substrate 42, a dielectric layer 46, and an embedded waveguide core 44 is shown in FIG. 1. The substrate may be in the form of a crystalline silicon wafer that is essentially undoped. Dielectric layers are deposited sequentially on the substrate and subjected to lithographic processes to form, for example, a buried silicon nitride waveguide core 44 within a silicon dioxide layer 46. Etch selectivity of SiN over $SiO_2$ allows the selective etching of a silicon nitride layer to form the waveguide core 44.

In an exemplary embodiment, plasma enhanced chemical vapor deposition (PECVD) is used to deposit the silicon dioxide layer 46. PECVD may also be employed for forming the silicon nitride layer as a blanket layer on the silicon dioxide layer. The silicon nitride deposited has the formula $Si_3N_4$ in some embodiments and has uniform optical properties. The thickness of the silicon nitride layer is uniform and corresponds to the desired thickness of the waveguide(s) formed later in the process. In some embodiments, the thickness of the silicon nitride layer is between about one hundred to five hundred nanometers (100-500 nm). This thickness range should be considered exemplary as opposed to limiting. In one embodiment, the thickness of the silicon nitride layer is about two hundred nanometers. The silicon nitride layer may be planarized following deposition using a chemical mechanical planarization process. A patterned mask is formed on the silicon nitride layer. The exposed portions of the silicon nitride layer are removed, leaving only the waveguide core(s) 44 on the silicon dioxide layer 46. Silicon nitride can be selectively removed either by wet etch (e.g., aqueous solution containing phosphoric acid) or dry etch (e.g., a plasma containing $CH_3F$ and $O_2$). The width of the silicon nitride waveguide core is between about one hundred and five hundred nanometers (100-500 nm) in some embodiments. Gratings (not shown in FIG. 1) are optionally formed on portions of the waveguide core to facilitate optical coupling. Additional silicon dioxide is deposited over the waveguide core 44, thereby encapsulating the silicon nitride core in a silicon dioxide (cladding) layer. Silicon nitride and silicon dioxide have different refractive indices allows the confinement of light within the resulting waveguide. The top surface of the deposited silicon dioxide material is planarized to obtain the structure 40 shown in FIG. 1.

Figure 2:
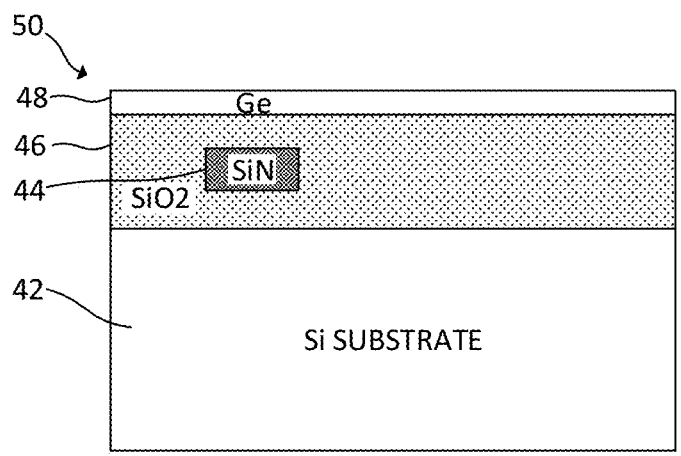
FIG. 2 is a view of the structure shown in FIG. 1 following deposition of a germanium layer on the top surface of the monolithic structure.

A top semiconductor device layer 48 is formed on the top surface of the silicon dioxide layer 46 to obtain a structure 50 as shown in FIG. 2. Germanium has a lattice constant that is essentially the same as that of gallium arsenide (GaAs) and is employed as the top device layer in exemplary embodiments. It can accordingly be used as a base layer for integration of GaAs-based devices. The germanium deposition process may employ the deposition chamber of a chemical vapor deposition type apparatus, such as a low pressure chemical vapor deposition (LPCVD) or a metalorganic chemical vapor deposition (MOCVD) apparatus. A germanium gas source may, for example, be selected from the group consisting of germane, digermane, halogermane, dichlorogermane, trichlorogermane, tetrachlorogermane and combinations thereof. The temperature for epitaxial germanium deposition typically ranges from 450° C. to 900° C. In some embodiments, the germanium device layer 48 is transferred to the silicon dioxide layer 46 from a bulk crystalline host (not shown) using known layer transfer techniques such as SMART CUT®. In these techniques, a thin layer of crystalline semiconductor is transferred from a host substrate and bonded onto an insulating handle (carrier) substrate. The transfer and/or bonding methods are different in different layer transfer techniques. One method of forming a GeOI substrate using the SMART CUT® method and wafer bonding involves bonding two semiconductor substrates with silicon oxide surface layers. The two wafers are bonded together at the silicon oxide surfaces to form a BOX layer between the two semiconductor substrates. The silicon dioxide layer 46 between the germanium and silicon layers 48, 42 forms the BOX layer of the structure 50 shown in FIG. 2. U.S. Pat. No. 5,374,564, which is incorporated by reference herein, discloses an exemplary layer forming and transfer process. U.S. Pat. No. 6,326,285, also incorporated by reference herein, discloses techniques for semiconductor on insulator fabrication, including hydrogen implantation, wafer bonding, and cleaving along the hydrogen layer. Alternately. a thinned device wafer can be created by controlled spalling technology and subsequent layer transfer. Exemplary controlled spalling technology for forming device wafers is disclosed in U.S. Pat. No. 8,841,203, which is incorporated by reference herein.

A further option for incorporating the germanium layer 48 includes epitaxially growing a germanium (Ge) layer on a Si substrate with a silicon germanium (SiGe) buffer layer (Ge/SiGe/Si) as the source of single crystalline Ge to be transferred and later patterned to form a semiconductor device layer. A SMART CUT or controlled spalling process is employed to separate a Ge layer of desired thickness from the Ge/SiGe/Si structure and transfer this top Ge layer to another Si substrate having an oxide layer (SiO2/Si) (such as shown in FIG. 1) to form the GeOI template shown in FIG. 2 on which III-V layers can later be grown. Germanium grown on silicon with a thick SiGe gradient buffer layer has sufficiently high quality to enable forming optoelectronic light emission devices thereon. The advantage of this approach is to use a high mechanical strength, large size Si substrate, having, for example, a diameter of twelve inches or even larger. Single crystal Ge substrates are not presently available for this large size. The Ge layer is first bonded to $SiO_2$/Si substrate 40 and then separated from its host substrate. The process is similar to the SMART CUT process that is often used to form semiconductor-on-insulator (SOI) substrates.

The Ge layer employed as the top semiconductor device layer is crystalline, and preferably essentially mono-crystalline. The germanium layer may have a thickness between about twenty and one hundred nanometers (20-100 nm). If necessary, a silicon germanium or a III-V layer can be used to form the semiconductor device layer 48 instead of germanium.

Figure 3:
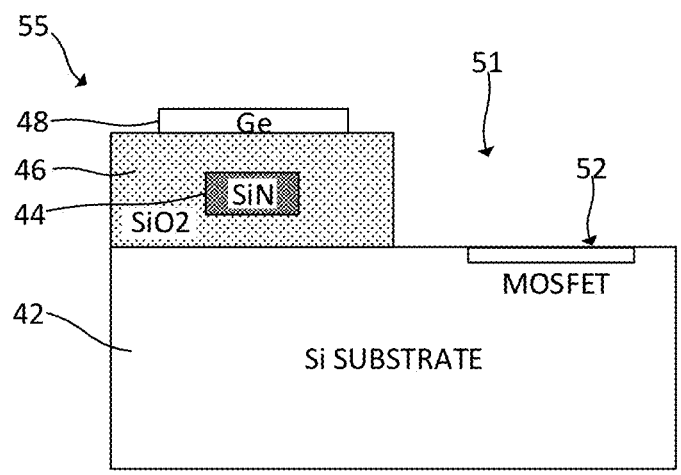
FIG. 3 is a schematic, cross-sectional view showing the monolithic structure following recessing the dielectric layer down to the top surface of a first portion of the substrate, formation of a MOSFET device using the first portion of the substrate, and patterning of the germanium layer over the second portion of the substrate.

Referring to FIG. 3, the germanium layer 48 employed in the exemplary embodiment is patterned such that the remaining portion of the germanium layer is directly above the waveguide. Germanium may be etched selectively with respect to dielectric materials such as silicon dioxide by using a dry etch process (e.g. a plasma containing $CF_4$ and $O_2$) or a wet etch process (e.g. a solution containing hydrochloric acid). The remaining portion of the germanium layer above the waveguide core 44 has predetermined dimensions and is configured to correspond to those of a III-V optoelectronic light emitting device to be formed thereon by the selective deposition of III-V semiconductor layers. In embodiments wherein the III-V optoelectronic light emitting device is configured with tapered end portions, the germanium layer is patterned using photolithographic techniques to include tapered end portions having converging edges. The region of the patterned germanium layer between such tapered end portions may include parallel edges. The silicon dioxide layer 46 is then recessed down to the top surface of the substrate 42 in regions to be employed for MOSFET 52 or other electronic device fabrication. The waveguide region is protected by a mask (not shown) during a reactive ion etch to form the recess(es) 51 in the silicon dioxide layer.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. The formation of MOSFETs on silicon substrates is known to the art and continues to be developed. A structure 55 including a waveguide on a first lateral region of a semiconductor substrate and a MOSFET 52 on a second lateral region of the semiconductor substrate 42 is obtained at this stage of the fabrication process. The semiconductor device layer 48 obtained following patterning of the originally formed semiconductor (e.g. germanium) layer is entirely above the first lateral (waveguide) region of the semiconductor substrate.

Figure 4:
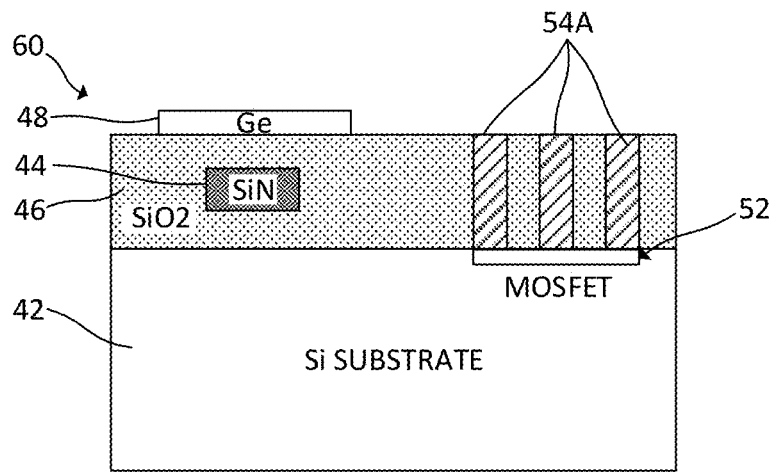
FIG. 4 is a schematic, cross-sectional view showing the monolithic structure of FIG. 3 following deposition of dielectric material over the MOSFET device and forming metal conductors within the deposited dielectric material.

Silicon dioxide is deposited on the structure 55 using, for example, chemical vapor deposition. The silicon dioxide fills the recess 51, thereby covering the MOSFET 52. It also adjoins the exposed vertical surface of the silicon dioxide layer 46 encapsulating the waveguide core 44. The top surface of the deposited material is then planarized. The silicon dioxide layer formed by the originally deposited material and the material later deposited to fill the recess 51 forms an integral layer designated by numeral 46 in FIG. 4. Via conductors 54A are formed within the silicon dioxide layer and are electrically connected to gate, source and drain regions of the MOSFET 52. Via openings within the silicon dioxide layer 46 may be formed using photolithography and etch processes. The via openings are filled with an electrically conductive material such as a metal to provide a first set of via conductors 54A. The electrically conductive material may be deposited using a physical vapor deposition (PVD) process such as plating or sputtering. FIG. 4 schematically illustrates a monolithic structure 60 obtained at this stage of the fabrication process.

Figure 5:
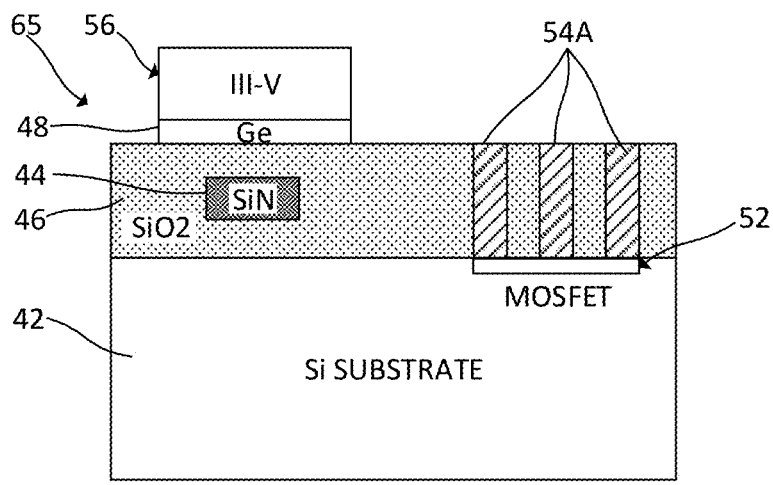
FIG. 5 is a schematic, cross-sectional view showing the structure of FIG. 4 following epitaxial growth of III-V semiconductor layers on the germanium layer.

Referring to FIG. 5, a stack 56 of III-V semiconductor materials is epitaxially grown on the top surface of the germanium layer 48. The stack 56 includes III-V layers used to form an optoelectronic light emission device. The terms "epitaxial growth and/or deposition" and "epitaxially formed and/or grown" mean the growth of a semiconductor material (crystalline material) on a deposition surface of another semiconductor material (crystalline material), in which the semiconductor material being grown has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. Growth of the III-V stack is selective to the germanium layer or other underlying semiconductor layer on which each III-V layer is grown. The III-V stack will accordingly have essentially the same dimensions and configuration as the patterned germanium layer 48 on which it is grown.

The III-V semiconductor stack 56 grown on the germanium device layer 48 may include a buffer layer such as InGaP, GaAs, or other compound semiconductor material depending on the material employed to form the stack 56. Such a buffer layer would have a lattice dimension between the lattice dimension of the germanium layer 48 comprising the base semiconductor substrate and the base layer of III-V semiconductor material for the optoelectronic light emission device formed from subsequently deposited III-V layers. The buffer layer reduces defects and undesired stresses in the layers comprising the optoelectronic light emission device.

Following the possible formation a buffer layer, the first layer that provides the base of the optoelectronic light emission device may be formed. A III-V semiconductor material layer having a first conductivity type is formed using an epitaxial deposition process. For example, the first III-V semiconductor layer may have n-type conductivity. In other embodiments, the first III-V semiconductor material layer may have p-type conductivity. The dopant may be introduced via ion implantation or in situ. By "in situ" it is meant that the dopant that dictates the conductivity type of the doped layer is introduced during the process step, e.g., epitaxial deposition, that forms the doped layer. The effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donors depending on whether they occupy the site of group III or group V atoms, respectively. Such impurities are known as amphoteric impurities.

III-V compound semiconductors are obtained by combining group III elements (for example, Al, Ga, In) with group V elements (for example, N, P, As, Sb). GaAs, InGaAs, InP, GaP, and GaN are examples of III-V compound semiconductors. In one exemplary embodiment, GaAs is epitaxially grown on the essentially defect-free top portion of the germanium (Ge) layer 48. As GaAs and Ge have essentially the same lattice constant, strain-induced defects are avoided in this embodiment and a buffer layer is not required. Various processes are familiar to those of skill in the art for epitaxially growing III-V semiconductor materials on semiconductor substrates such as germanium substrates. In the case of group III-V semiconductor materials, such processes include metalorganic chemical vapor deposition (MOCVD) and molecular beam epitaxy (MBE). Many different III-V compounds could be grown on the germanium layer 48 (or buffer layer thereon) depending upon the lattice constants of the III-V material and the goal of avoiding strain-induced epitaxial defects. Accordingly multiple precursors could be used. Depending on which III-V materials are to be grown and which precursors are used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on germanium and on other semiconductor materials are well known in the art and new methods continue to be developed.

The first III-V semiconductor layer of the optoelectronic light emission device is typically grown to a thickness ranging from one micron to two microns (1-2 μm). Following formation of the first III-V semiconductor material layer having the first conductivity type, the layers of a III-V multiple quantum well layered stack may be epitaxially formed on the first III-V semiconductor layer. The III-V multiple quantum well layered stack may include a layered stack of intrinsic III-V semiconductor materials. The epitaxial deposition process for forming the III-V multiple quantum well layered stack may be a selective epitaxial deposition process wherein the III-V semiconductor material only on forms on the exposed semiconductor surfaces, such as the upper surface of the first conductivity type III-V semiconductor material layer of the optoelectronic light emission device and is not formed on dielectric surfaces. The different compositions of the III-V multiple quantum well layered stack may be provided by changing and cycling the precursor gases used in growing the different layers comprising the III-V multiple quantum well layered stack.

Following the formation of the III-V multiple quantum well layered stack of the optoelectronic light emission device, a second III-V semiconductor layer having a second conductivity type is epitaxially formed on a top surface of the III-V multiple quantum well layered stack. The second conductivity type is opposite to the first conductivity type. For example, when the first doped III-V semiconductor layer of the stack 56 has n-type conductivity, the second doped III-V semiconductor layer at the top of the stack 56 has p-type conductivity. The III-V stack may be planarized, e.g., processed with chemical mechanical planarization.

Figure 6:
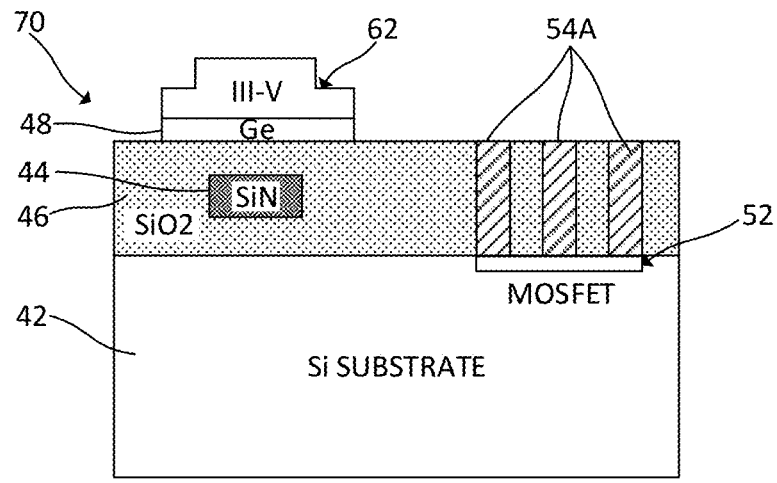
FIG. 6 is a schematic, cross-sectional view showing the structure of FIG. 5 following further processing of the III-V semiconductor layers to form a III-V light source.

The structure 70 illustrated in FIG. 6 includes a completed optoelectronic light emission device 62 following patterning of the III-V stack 56 to expose portions of the doped III-V layer adjoining the germanium layer 48 on which it is directly or indirectly grown. Such patterning can be performed using photolithographic and anisotropic etching techniques known to the art. Metal contacts (not shown) can then be formed on the doped III-V layers of the optoelectronic light emission device by a physical vapor deposition (PVD) method such as sputtering or plating.

The exemplary optoelectronic light emission device 62 depicted in FIG. 6 may be a quantum well laser in which the wavelength of the light emitted by the quantum well laser is determined by the width of the active region rather than just the bandgap of the material from which it is constructed. The first and second III-V semiconductor material layers, which may also be referred to as cladding layers, are doped to have opposite conductivity types. In some embodiments, the doped III-V semiconductor layers function to pump charge carriers, i.e., electron and hole charge carriers, into the intrinsic active area provided by the quantum well. In some examples, the doped first and second III-V semiconductor layers may be composed of InP, GaAs, AlGaAs, InAlAs or a combination thereof. The dopants that provide the conductivity types of the first and second III-V semiconductor layers of the device may be present in a concentration ranging from $10^{17}$ atoms/cm$^3$ to $10^{20}$ atoms/cm$^3$. In some examples, the first (bottom) III-V semiconductor layer may have a thickness ranging from 100 nm to 2,000 nm. In some embodiments, the second (top) doped III-V semiconductor layer may be composed of InP, GaAs, AlGaAs or InAlAs. In some examples, the second (top) III-V semiconductor layer of the device may have a thickness ranging from 100 nm to 2,000 nm. It is noted that the above compositions and thicknesses are provided for illustrative purposes only, and are not intended to limit the present disclosure. The active region of the laser diode is in the intrinsic (I) region. By "intrinsic" it is meant that the region is not doped with an extrinsic dopant, e.g., n-type or p-type dopant, such as the dopants within the first and second III-V semiconductor material layers of the III-V stack 56. The "intrinsic" III-V layers may include some unintentional doping resulting from diffusion of dopant ions from the doped III-V layers. The active region in the quantum well structure is formed by alternating layers of relatively low bandgap material and layers of relatively high bandgap material. As used herein, a "low bandgap" is a bandgap ranging from 0.5 eV to 3.0 eV; a "high bandgap" ranges from 1.0 eV to 3.5 eV. The low bandgap layers are termed "well layers" and the high bandgap layers are termed "barrier layers." For example, the active low bandgap layers may comprise $Al_rGa_{1-r}As$ and the passive high bandgap layers may comprise $Al_zGa_{1-z}As$ with r<z.

The thickness of each layer of III-V compound semiconductor material within the quantum well is preferably no greater than about 50 nm, and is for example between five and ten nanometers (5-10 nm) in some embodiments. The stacked structure of quantum wells may, for example, include up to one hundred layers. In some embodiments, the stacked structure of quantum wells is composed of five layers or less of semiconductor material. The quantum well (QW) layers and barrier layers of the quantum well structure may be formed, for example, of $In_xGa_{1-x}As_yP_{1-y}$, $In_xGa_{1-x}As$, $In_xGa_{1-x}N_yAs_{1-y}$, $In_xGa_{1-x}As_y$ Sb (where, 0.0<x<1.0, 0.0<y<1.0).

The optoelectronic light emission device 62 may have a width ranging from three (3) microns to five (5) microns. The width dimension of the optoelectronic light emission device 62 is along a dimension perpendicular to the direction along which the optoelectronic light emission device 62 emits a beam of light. In some embodiments, the width may range from 2.75 microns to 4.25 microns, and in one example is equal to 4 microns. The length of the optoelectronic light emission device 62 may range from approximately 50 microns to approximately 300 microns. In one example, the length of the optoelectronic light emission device 62 may be approximately 80 microns. In some embodiments, the waveguide core 44 is between two hundred and two thousand nanometers (200-2,000 nm) from the top surface of the silicon dioxide layer 46 on which the germanium layer 48 is formed. The distance between the waveguide core 44 and the optoelectronic light emission device 62 is within a distance comparable to the wavelength of the light to be emitted by the device in some embodiments.

Figure 7:
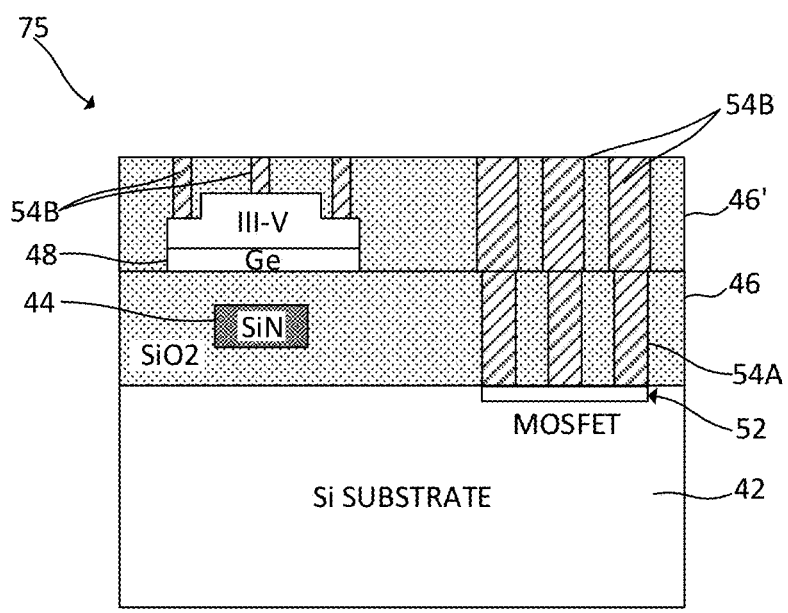
FIG. 7 is a schematic, cross-sectional view showing the structure of FIG. 6 following deposition of a second dielectric layer over the III-V light source and formation of metal conductors within the second dielectric layer.

A second dielectric layer 46' is formed over the bottom dielectric layer 46. The second dielectric layer may, like the underlying dielectric layer, also consist essentially of silicon dioxide. The optoelectronic light emission device 62 is encapsulated by the second dielectric layer 46'. Via conductors 54B are formed within the second dielectric layer. Some of the via conductors are electrically connected to the doped bottom and top layers of the optoelectronic light emission device 62 while others are electrically connected to the via conductors 54A in the bottom silicon dioxide layer 46. FIG. 7 shows the structure 75 following formation of the second metallized layer.

Figure 8A:
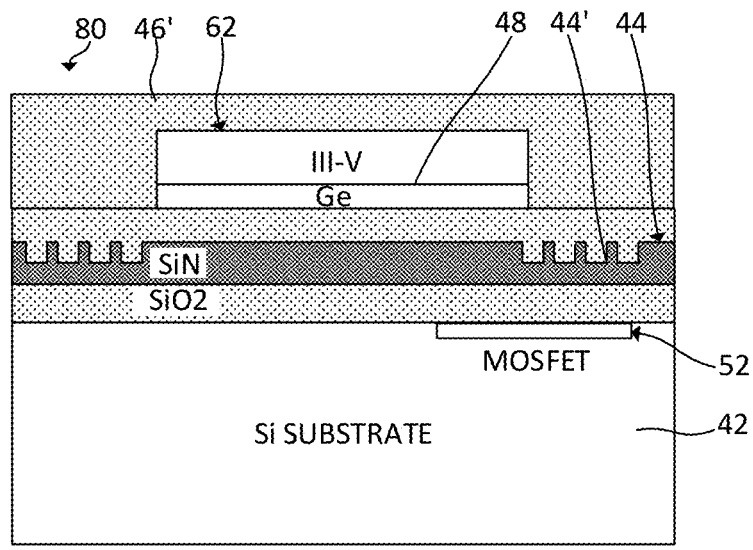
FIG. 8A is a schematic, cross-sectional view showing light coupling of the III-V light source and the waveguide of the structure of FIG. 7.
Figure 8B:
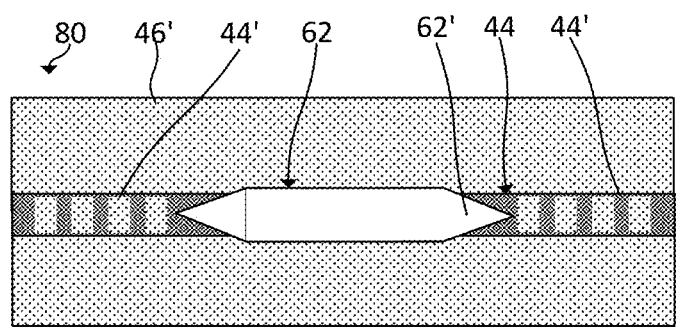
FIG. 8B is a top view showing light coupling of the III-V light source and the waveguide of the structure of FIG. 7.
Figure 9:
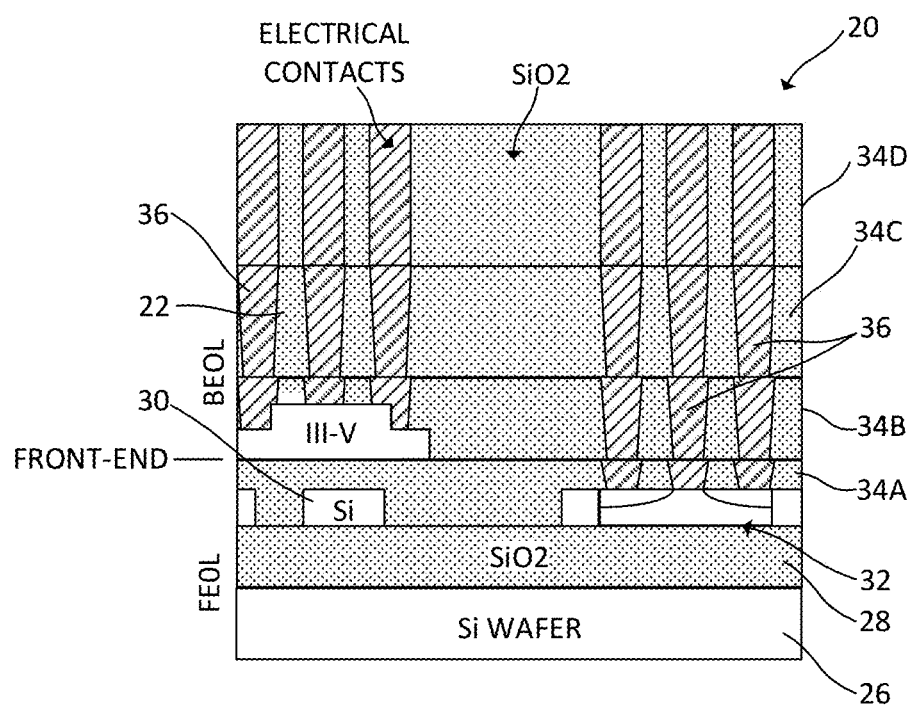
FIG. 9 is a schematic, cross-sectional view showing an integrated waveguide and light source in accordance with the prior art.

FIGS. 8A and 8B further schematically illustrate the arrangement of the optically coupled optoelectronic light emission device 62 and waveguide core 44. As shown in these figures, the waveguide core 44 includes gratings 44' therein to facilitate light coupling. The portion of the waveguide core 44 directly beneath the optoelectronic light emission device 62 has a planar top surface. As shown in FIG. 8B, the end portions 62' of the optoelectronic light emission device 62 and underlying semiconductor (e.g. Ge) device layer are tapered to further facilitate light coupling. The optoelectronic light emission device 62 and the semiconductor device layer 48 on which it is grown have longitudinal axes parallel to the longitudinal axis of the waveguide core 44, as best shown in FIG. 8B.

Electronic devices comprising the III-V optoelectronic device and associated waveguide may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a an optoelectronic device includes obtaining a first structure including a semiconductor substrate 42 including a first region and a second region, the second region being laterally displaced from the first region, a bottom dielectric layer 46 on the semiconductor substrate, and a buried waveguide core 44 within the bottom dielectric layer and directly above the first region of the semiconductor substrate. FIG. 1 schematically illustrates an exemplary first structure 40. A semiconductor layer 48 such as a germanium layer is formed on the bottom dielectric layer 46 to obtain a structure 50 as exemplified in FIG. 2. A recess 51 is formed within the bottom dielectric layer over the second region of the semiconductor substrate 42 and a field-effect transistor is formed in the second region of the semiconductor substrate 42, thereby obtaining the exemplary structure 55 as shown in FIG. 3. The recess 51 is filled with dielectric material and first electrical conductors 54A are formed within the dielectric material, the first electrical conductors being electrically connected to the field-effect transistor 52 as schematically illustrated in FIG. 4. Following patterning of the semiconductor layer to form a device layer having appropriate dimensions, a stack 56 of epitaxial III-V semiconductor layers is selectively grown on the device layer over the first region of the semiconductor substrate and comprises an optoelectronic structure configured for light emission. The optoelectronic structure is patterned to obtain a structure 70 as schematically illustrated in FIG. 6. A top dielectric layer 46' is formed over the bottom dielectric layer 46 and the dielectric material filling the recess 51. The top dielectric layer 46' encapsulates the optoelectronic structure 62 formed from the stack of III-V semiconductor layers. Second electrical conductors 54B are formed within the top dielectric layer 46' and are electrically connected to the first electrical conductors and the optoelectronic structure 62 as shown in FIG. 7. The buried waveguide core 44 may be a dielectric waveguide core extending directly beneath the optoelectronic structure 62. In some embodiments, the buried waveguide core consists essentially of silicon nitride and the semiconductor layer consists essentially of germanium. A germanium layer is obtained in some embodiments by epitaxially growing a graded silicon germanium layer on a silicon base. The silicon germanium layer has an increasing germanium content as the silicon germanium layer is grown to facilitate lattice matching of the subsequently grown germanium layer. An essentially monocrystalline germanium layer is epitaxially grown on the silicon germanium layer. The germanium layer is transferred to the structure 40 shown in FIG. 1 using a selected layer transfer technique and bonded to the dielectric layer 46. The transferred layer includes at least a surface portion that consists essentially of germanium to facilitate subsequent growth of III-V semiconductor layers thereon.

Further given the above discussion, a monolithic optoelectronic structure is provided in accordance with a further aspect of the invention. A semiconductor substrate 42 includes a first region and a second region, the second region being laterally displaced from the first region. A bottom dielectric layer 46 is on the semiconductor substrate 42. A buried waveguide core 44 is within the bottom dielectric layer and is located directly above the first region of the semiconductor substrate. A germanium layer 48 is on a top surface of the bottom dielectric layer and is positioned above the waveguide core 44. A field-effect transistor 52 is in the second region of the semiconductor substrate and located beneath the bottom dielectric layer 46. First electrical conductors 54A are electrically connected to the field-effect transistor. The monolithic optoelectronic structure further includes an optoelectronic light emission device 62 comprising a plurality of epitaxial III-V semiconductor layers on the germanium layer. A top dielectric layer 46' encapsulates the optoelectronic light emission device 62. Second electrical conductors 54B within the top dielectric layer 46' are electrically connected to the first electrical conductors 54A and to the optoelectronic light emission device 62. The III-V semiconductor layers comprise a quantum well in some embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having optoelectronic or other devices therein.

An integrated circuit in accordance with aspects of the present disclosure can be employed in essentially any application and/or electronic system where the use of optoelectronic devices would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating an optoelectronic device, comprising:
    obtaining a first structure including:
        a semiconductor substrate including a first region and a second region, the second region being laterally displaced from the first region,
        a bottom dielectric layer on the semiconductor substrate, and
        a buried waveguide core within the bottom dielectric layer and directly above the first region of the semiconductor substrate;
    forming a semiconductor layer on the bottom dielectric layer;
    forming a recess within the bottom dielectric layer over the second region of the semiconductor substrate;
    forming a field-effect transistor in the second region of the semiconductor substrate;
    filling the recess with dielectric material;
    forming first electrical conductors within the dielectric material, the first electrical conductors being electrically connected to the field-effect transistor;
    patterning the semiconductor layer to form a semiconductor device layer over the first region of the semiconductor substrate;
    epitaxially growing a plurality of III-V semiconductor layers on the semiconductor device layer over the first region of the semiconductor substrate, the III-V semiconductor layers comprising an optoelectronic structure configured for light emission;
    patterning the optoelectronic structure;
    forming a top dielectric layer over the bottom dielectric layer and the dielectric material filling the recess, the top dielectric layer encapsulating the optoelectronic structure, and
    forming second electrical conductors within the top dielectric layer, the second electrical conductors being electrically connected to the first electrical conductors and the optoelectronic structure.

2. The method of claim 1, wherein the buried waveguide core is a dielectric waveguide core extending directly beneath the optoelectronic structure.

3. The method of claim 2, wherein the buried waveguide core consists essentially of silicon nitride.

4. The method of claim 3, wherein the bottom dielectric layer consists essentially of silicon dioxide and the semiconductor substrate consists essentially of silicon.

5. The method of claim 4, wherein the semiconductor device layer consists essentially of germanium.

6. The method of claim 5, wherein forming the semiconductor layer on the bottom dielectric layer includes transferring an essentially monocrystalline germanium layer from a second semiconductor substrate to a top surface of the bottom dielectric layer.

7. The method of claim 6, further including forming the second semiconductor substrate by:
    epitaxially growing a graded silicon germanium layer on a silicon base, the silicon germanium layer having an increasing germanium content as the silicon germanium layer is grown, and epitaxially growing the essentially monocrystalline germanium layer on the silicon germanium layer.

8. The method of claim 1, wherein the semiconductor device layer consists essentially of germanium.

9. The method of claim 8, wherein patterning the semiconductor layer further includes forming a semiconductor device layer having tapered end portions.

10. The method of claim 1, wherein patterning the semiconductor layer further includes forming the semiconductor device layer with a longitudinal axis extending in the same direction as a longitudinal axis of the waveguide core.

* * * * *